United States Patent [19]

Pattanayak et al.

[11] Patent Number: 4,847,671
[45] Date of Patent: Jul. 11, 1989

[54] MONOLITHICALLY INTEGRATED INSULATED GATE SEMICONDUCTOR DEVICE

[75] Inventors: Deva N. Pattanayak; Bantval J. Baliga, both of Schenectady, N.Y.

[73] Assignee: General Electric Company, Schenectady, N.Y.

[21] Appl. No.: 51,424

[22] Filed: May 19, 1987

[51] Int. Cl.$^4$ .............................................. H01L 29/74
[52] U.S. Cl. ..................................... 357/38; 357/23.4; 357/23.14; 357/43; 357/86
[58] Field of Search ............... 357/23.4, 43, 38, 23.14, 357/86

[56] References Cited

U.S. PATENT DOCUMENTS

| | | | |
|---|---|---|---|
| 4,199,774 | 4/1980 | Plummer | 357/41 |
| 4,364,073 | 12/1982 | Becke et al. | 357/23 |
| 4,443,931 | 4/1984 | Baliga et al. | 29/571 |
| 4,502,070 | 2/1985 | Leipold et al. | 357/23.4 |
| 4,604,638 | 8/1986 | Matsuda | 357/23.4 |
| 4,729,007 | 3/1988 | Coe | 357/38 |

OTHER PUBLICATIONS

Russell, J. P. et al., "The COMFET-A New High Conductance MOS-Gated Device," *IEEE Electron Device Letters*, vol. EDL-4, No. 3, Mar. 1983, pp. 63-65.
Plummer, J. D. et al., "Insulated-Gate Planar Thyristors: I-Structure and Basic Operation", *IEEE Transactions on Electron Devices*, vol. ED-27, No. 2, Feb. 1980, pp. 380-386.
Scharf, B. W. et al., "Insulated-Gate Planar Thyristors: II-Quantitative Modeling", *IEEE Transactions on Electron Devices*, vol. ED-27, No. 3, pp. 381-393.

*Primary Examiner*—Joseph E. Clawson, Jr.
*Attorney, Agent, or Firm*—Robert Ochis; James C. Davis, Jr.; Marvin Snyder

[57] ABSTRACT

A monolithically integrated semiconductor device preferably comprising a thyristor driven transistor is disclosed. The thyristor provides a base drive sufficient to fully turn-on an inherent bipolar transistor and achieve the maximum benefit of bipolar conduction within the semiconductor device. The thyristor can be turned on and off through insulated gate control by decoupling the emitter region of the thyristor from the cathode electrode of the device.

10 Claims, 24 Drawing Sheets

CONVENTIONAL DEVICE

MONOLITHICALLY INTEGRATED INSULATED GATE SEMICONDUCTOR DEVICE

This application relates to insulated gate semiconductor devices and more particularly, to a monolithically integrated semiconductor device which employs a first active portion comprising a four layer structure such as a thyristor, to drive a second active portion comprising a three layer structure such as a bipolar transistor. The disclosed device comprises an insulated gate controlled monolithic structure in which the first portion supplies sufficient drive current to the second portion to fully turn-on the second portion. Control signals applied to insulated gates control all operating modes of the composite device.

RELATED APPLICATIONS

This application is related to U.S. patent application Ser. No. 051,427, "Monolithically Integrated Lateral Semiconductor Device", U.S. patent application Ser. No. 051,359, "Improved Monolithically Integrated Semiconductor Device and Process of Fabrication", U.S. patent application Ser. No. 051,422, "Monolithically Integrated Bidirectional Lateral Semiconductor Device With Insulated Gate Control in Both Directions and Method of Fabrication" and U.S. patent application Ser. No. 051,430, "Monolithically Integrated Semiconductor Device Having Reverse Conducting Capability and Method of Fabrication" filed concurrently herewith and assigned to the assignee hereof and both of which are incorporated by reference herein.

BACKGROUND OF THE INVENTION

Insulated gate transistors have been proposed in which an insulated gate is used to control the conductance of an inherent bipolar transistor. An example of one such device is shown in FIG. 1A of this application and the equivalent circuit derived therefrom is disclosed in FIG. 1B. FIG. 1A is based on FIG. 14 of U.S. Pat. No. 4,443,931 to Baliga et al. for "Method of Fabricating a Semiconductor Device With a Base Region Having a Deep Portion". In these structures, the base of the inherent bipolar transistor is coupled through a MOS channel to the collector which becomes the base drive current supply. Thus in these prior devices, the base drive current is derived from the collector region. The base drive current is the MOS channel current. In the insulated gate structures heretofore known, while the inherent transistor has been activated, the conductivity of the base region of the inherent transistor has not been fully modulated due to a lack of sufficient base drive current. More particularly, in typical insulated gate transistors, the inherent bipolar transistor is believed to operate at between 40 and 60% of its capacity. Specifically, the conductivity modulation of the device shown in FIG. 1A is reduced in the region above the P-base, which region is referred to as the so-called JFET region. This reduced conductivity introduces an unwanted voltage drop in the JFET region. While an additional implant in the JFET region can reduce the voltage drop, the additional implant will also reduce the breakdown voltage and thus lowers the upper limit of the voltage drop which can be supported in the JFET region.

Thus an unfulfilled need exists for an insulated gate semiconductor device which fully utilizes the inherent bipolar transistor structure under normal operating conditions and is not limited by structurally imposed limitations upon forward drop.

OBJECTS OF THE INVENTION

A principal object of the invention is to provide an insulated gate semiconductor in which an inherent transistor is fully utilized and achieves a fully on-state under normal operating conditions.

An additional object is to provide a device including an emitter switched floating thyristor wherein the thyristor can be decoupled from the cathode of the device by an insulated gate structure to turn the thyristor and the device off.

A further object of the present invention is to provide an insulated gate semiconductor device comprising a monolithically integrated combination of an inherent bipolar transistor and an inherent thyristor.

A still further object of the present device is to provide a monolithic integrated semiconductor device in which an inherent transistor is situated adjacent an active base drive supply.

Another object of the present invention is to provide a device which includes an inherent thyristor which can establish a high carrier density in the base of the inherent transistor to reduce the series resistance of the base region of the inherent transistor by further increasing conductivity modulation of that region.

An additional object of the present invention is to provide an insulated gate semiconductor device comprising a monolithic structure of an inherent bipolar transistor and an insulated gate controlled active device.

SUMMARY OF THE INVENTION

These and other objects and features of the present invention are achieved in an insulated gate semiconductor device comprising a first layer of one type conductivity semiconductor material and a second layer of opposite type conductivity semiconductor material disposed thereon. A first region of one type conductivity is disposed within the second layer and forms a PN junction therewith. Second and third regions of opposite type conductivity are disposed within the first region and form PN junctions therewith. A first electrode ohmically contacts the first layer and a second electrode ohmically contacts the first and third regions. The second region is separated from the second electrode and the second layer by the first region and first and second controllable means respectively couple the second region to the second layer and the third region.

Upon activation of the first and second means, regenerative conduction is achieved in a first active device portion comprising the first layer, the second layer, and the first and second regions. This first portion is coupled to the second electrode through the third region by the second controllable means. The regenerative conduction in the first active portion supplies a base drive potential to a second device portion such as an inherent bipolar transistor comprising the first layer, second layer and first region. The regenerative conduction of the first device portion turns on the second device portion. The first device portion can be a current activated device, a light activated device portion or an insulated gate control device portion. In an alternate preferred embodiment, the first and second controllable means can comprise insulated gate structures. More particularly, the second means can comprise an insulated gate coupling the second region to said second layer. The first means can also comprise an insulated gate structure coupling the second region to the third region.

It is also within the scope of the present invention to provide a specially profiled first region wherein a first portion of the first region which comprises a base of the first active device portion is more lightly doped than the second portion of the first region comprising the collector of the second device. It is also within the scope of the present invention to counter dope those portions of the first region comprising the channel portions of the device. The first and second portions of the first region can be contiguous with each other, or alternatively, can be fabricated as discrete regions separated by a portion of the second layer. In the discrete first and second portion embodiment, the first means can comprise two discrete insulated gates with the first gate coupling the second region to a second portion of the second layer proximate the third region and the second gate coupling the second layer proximate the second region to the third region.

The insulated gate semiconductor device of the present invention thus comprises a monolithic structure comprising an inherent bipolar transistor second portion and an insulated gate controlled first active device portion wherein the inherent bipolar transistor portion and the first device portion are disposed within and share a common semiconductor substrate. The first device portion, under normal operating conditions, modulates the conductivity of the base region to reduce the series resistance of the base region and to fully turn-on said inherent bipolar transistor portion. It is preferred that the first device portion comprise a regenerative first device such as an insulated gate controlled floating thyristor. Such a structure provides a higher injected carrier density in the base region reducing its resistance below that achieved in a conventional insulated gate transistor. It is also preferred that the base of the thyristor comprise the collector of the inherent transistor. It is particularly within the scope of the present invention that the active device and the inherent transistor share common first and second electrodes and first and second layers.

The present invention thus provides an insulated gate semiconductor device which exhibits improved conductivity. More particularly, the disclosed structure fully utilizes the inherent bipolar transistor. Thus, the disclosed device can be operated with increased current density. Moreover, these improvements are achieved within a cell of a dimension which approximately equivalent to the dimension of a standard insulated gate transistor cell.

BRIEF DESCRIPTION OF THE DRAWINGS

The features of the invention which are believed to be novel are specified with particularity in the appended claims. The invention, itself, however, both as to organization and method of operation together with additional objects, features and advantages of the monolithically integrated insulated gate semiconductor device of the present invention can be best understood by reference to the following detailed description when considered in conjunction with the accompanying drawings in which:

DETAILED DESCRIPTION OF THE PREFERRED EMBODIMENTS

Figure 1A:
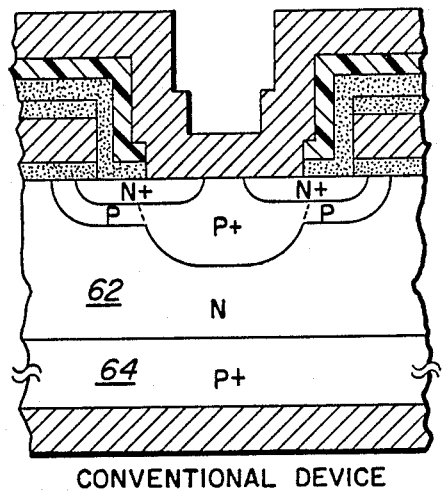
FIG. 1A is a cross-sectional illustration of a conventional insulated gate transistor.
Figure 1B:
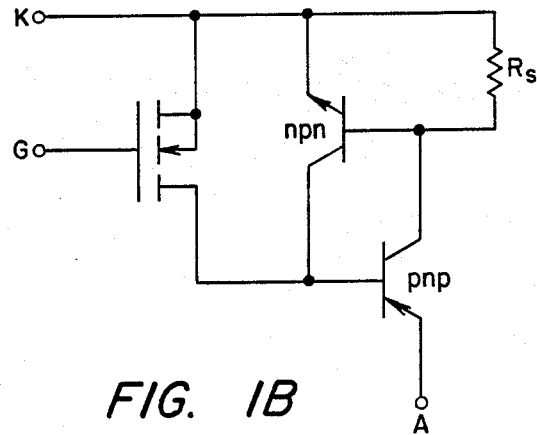
FIG. 1B is an illustration of an equivalent circuit of the insulated gate transistor of FIG. 1A.

The monolithically integrated semiconductor device of the present invention is applicable to a broad range of semiconductor devices and can be fabricated from a variety of different semiconductor materials. The ensuing description will disclose several preferred embodiments of the monolithically integrated semiconductor device of the present invention as implemented in a silicon substrate because silicon devices or devices fabricated in silicon substrates, make up an overwhelming majority of the currently available semiconductor devices. Consequently, the most commonly encountered applications of the present invention will involve silicon substrate devices. Nevertheless, it is intended that the invention disclosed herein can be advantageously employed in germanium, gallium arsenide and other semiconductor materials. Accordingly, application of the present invention is not intended to limited to devices fabricated in silicon semiconductor materials but will encompass those devices fabricated in any of a number of semiconductor materials.

Moreover, while the present description discusses a number of preferred embodiments directed to the silicon semiconductor devices, it is intended that these disclosures be considered as illustrative examples of the preferred embodiment of the present invention and not as a limitation on the scope or applicability of the present invention. Further, while the illustrated examples concern the improved conductivity monolithically integrated semiconductor device, in connection with insulated gate control structures, light activated structures and current activated structures, it is not intended that the monolithically integrated structure be limited to these devices. These device are included to demonstrate the utility and application of the present invention to what are considered preferred commercial embodiments. Specifically, the present invention is additionally readily applicable to those monolithically integrated structures which employ regenerative conduction and thus encompasses monolithically integrated TRIACs and DIACs as well as thyristors. Further, while the present invention provides for increased current conductivity and current density, it is recognized that the attendant benefits of reduced cell size and reduced cell repeat distance also result from the improved cell structure.

Given the corresponding relationship of FIGS. 2-8, corresponding parts have been designated with the same reference numeral as an aid to understanding the description of the invention. Various parts of the semiconductor elements, however, have not been drawn to scale. Certain dimensions have been exaggerated in relation to other dimensions in order to present a clearer illustration and understanding of the present invention. Although for the purposes of illustration, the preferred embodiments of the improved conductivity monolithically integrated semiconductor devices of the present invention are shown in each particular embodiment to include specific P and N type regions, it is to be understood that the teachings herein are equally applicable to monolithically integrated devices in which the conductivities of the various regions have been reversed, to for instance, provide for the dual of the illustrated device.

Further, although the embodiments illustrated herein are shown in two-dimensional views with various regions having depth and width, it is understood that these regions are illustrations of only a portion of a single cell of a device which is comprised of a plurality of cells arranged in a three-dimensional structure. Accordingly, these regions when fabricated in actual devices, will have three dimensions including length, width and depth.

Figure 2:
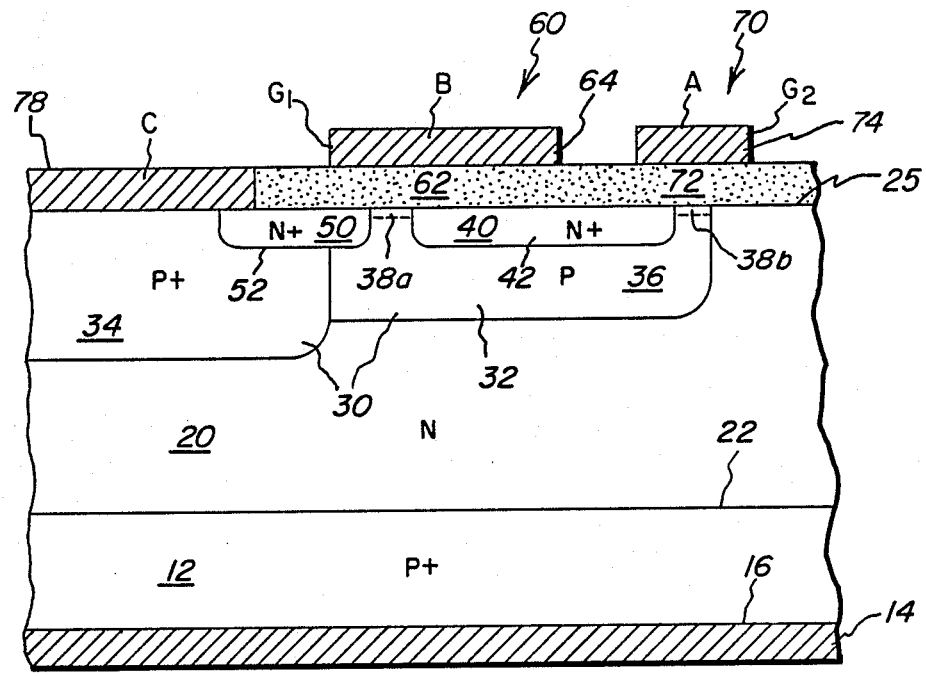
FIG. 2 is a cross-sectional illustration of a portion of a single cell of a monolithically integrated insulated gate semiconductor device in accordance with the present invention.

Referring now to FIG. 2, a preferred embodiment of the present invention as applied to a monolithically integrated insulated gate semiconductor device generally designated 10 comprising a novel insulated gate controlled thyristor-driven transistor, is shown. More particularly, a portion of a single cell of the insulated gate controlled thyristor-driven transistor device 10, which is symmetric about a vertical axis through the right-hand portion of the illustration, is shown. The monolithically integrated insulated gate semiconductor device 10 in accordance with the present invention, is shown to comprise a first layer 12 of one type conductivity which is illustrated as a P type conductivity layer. The first layer 12 is heavily doped which facilitates the formation of an ohmic contact with a first electrode 14 disposed on a first surface 16 of the first layer 12. A heavily doped first layer 12 also contributes to minority injection of carriers from the first layer 12 into a second adjacent layer 20. The second layer 20 can be disposed atop a second surface 22 of the first layer 12. The second layer 20 is illustrated to comprise an opposite type conductivity semiconductor material and is shown as an N type layer. The doping concentration of the second layer 20 is selected to permit the device to support a high voltage in the off-state. Either the first or second layer 12 and 20, respectively, can be deposited on the other layer by epitaxial growth, or alternatively, either layer can be established within the other layer by diffusion or implantation techniques within the other layer. A portion of the second layer 20 comprises a portion of the second surface 25 of the device 10.

A first region 30, comprising the one type conductivity semiconductor material, which is illustrated as P type semiconductor material, is disposed within the second layer 20 and comprises a second portion of the second surface 25 of the device 10. In a preferred embodiment, the first region 30 can be profiled to improve the conductivity of the various portions of the device 10. In the illustrated embodiment, the first region 30 comprises a heavily doped first zone 34 and a moderately doped second zone 36. The first region 30 forms a PN junction 32 with the second layer 20.

Second and third regions 40 and 50, respectively, comprising opposite type conductivity material which is shown as N type conductivity material, are disposed within the first region 30 and respectively form PN junctions 42 and 52 therewith. It is preferred that the second region 40 be heavily doped. The second region 40 is preferably disposed within the moderately doped second zone 36 of the first region 30 and also comprises a third portion of the second surface 25 of the device 10.

The third region 50 is also disposed within the first region 30. The third region 50 is isolated from or spaced apart from the second region 40 by the first region 30. The third region 50 is preferably heavily doped and disposed within the heavily doped first zone 34 of the first region 30. The third region 50 also forms a fourth portion of the second surface 25 of the semiconductor device 10.

The third region 50, in combination with the second region 40, defines a first channel region 38a of the first region 30 disposed between the second and third regions 40 and 50, respectively. A first insulated gate structure 60 is disposed atop the channel region 38a and preferably is disposed on the second surface 25 of the device 10 adjacent the channel region 38a. The insulated gate structure 60 preferably comprises an insulation layer 62 such as a silicon dioxide layer, which is disposed atop the second surface 25 of the semiconductor device 10. The insulation layer 62 is preferably coextensive with the channel 38a and can overlap the third and fourth portions of the second surface 25 of the semiconductor device 10. A gate electrode 64 is disposed atop the insulation layer 62. The gate material 64 can preferably comprise polysilicon, metal silicide or a refractory metal. The insulated gate 60 is preferably coextensive with the channel 38a and can overlap the second and third regions 40 and 50, respectively.

The second region 40, in combination with the second layer 20, defines a second channel portion 38b of the first region 30 disposed therebetween. A second insulated gate structure 70 is disposed proximate the channel region 38b and is preferably disposed atop the second surface 25 of the semiconductor device 10. The insulated gate structure 70 can comprise an insulation layer 72, such as a silicon dioxide layer, which can comprise a further portion of the insulation layer 62. The insulation layer 62 is situated atop the second surface 25 of the device 10, and a gate electrode 74 is disposed atop the insulation layer 72. The insulation layer 72 can comprise a second portion of the insulation layer 62 and the gate layer 74 can comprise polysilicon, metal silicide or a refractory metal. The insulated gate structure 70 and the electrode 74 thereof preferably is at least coextensive with the channel 38b and advantageously overlaps the second region 40 and the second layer 20.

A second electrode 78 is preferably disposed on the second surface 25 of the semiconductor device 10 and in ohmic contact with both the first and third regions 30 and 50, respectively. The second electrode 78 preferably shorts the junction 52 between the third region 50 and the first region 30 to inhibit bipolar conduction across the junction 52 to thereby inhibit activation of an inherent transistor comprising the second layer 20, the first region 30 and the third region 50 which is illustrated as an NPN transistor.

As used herein, the term "inherent transistor" is used to designate those structures comprising three adjacent zones of alternate conductivity semiconductor material which can, for instance, form PNP or NPN bipolar transistors, but which lack an external connection to one or more zones of the device. Specifically, in the device illustrated in FIG. 2, several inherent bipolar transistors can be found. The primary inherent bipolar transistor or that inherent transistor which is activated by regenerative conductive action of the active portion of the present device, comprises the first layer 12, the second layer 20 and the first region 30 which is illustrated as a PNP transistor disposed between the first and second electrodes 14 and 78, respectively. The second layer 20 or base portion of this device is not directly connected to an external electrode. Some other inherent transistors comprise the second layer 20, the first region 30 and the second region 40 as well as the second layer 20, the first region 30 and the third region 50.

Figure 3:
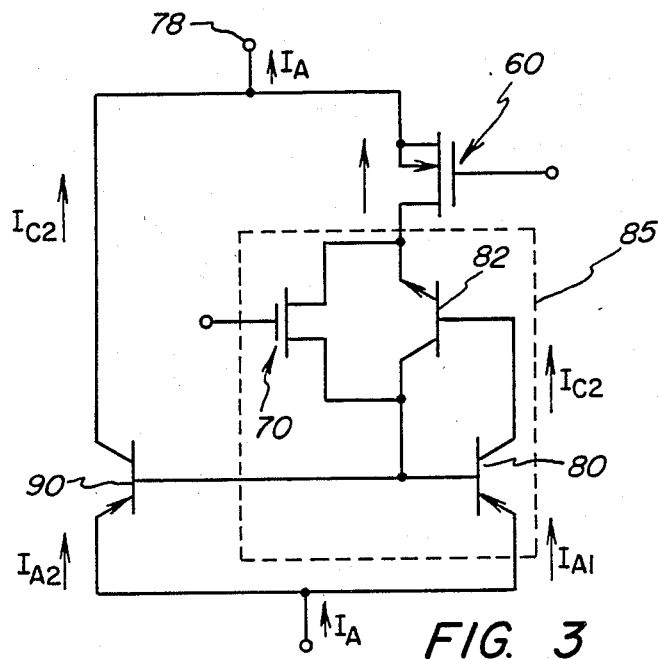
FIG. 3 is an illustration of an equivalent circuit of the monolithically integrated insulated gate semiconductor device of FIG. 2.

The operation of the monolithically integrated semiconductor device of FIG. 2 will now be described in connection with the equivalent circuit of this device shown in FIG. 3. More particularly, the device of FIG. 2 can be analyzed to comprise a first inherent PNP transistor 90 including the first layer 12, the second layer 20 and the first zone 34 of the first region 30 formed between the first electrode 14 and the second electrode 78. The base of the first inherent transistor 90 is not exposed on an external surface of the device and thus cannot be directly contacted. Instead, the device 10 also includes an inherent thyristor 85 which supplies the base drive to first inherent transistor 90. The thyristor 85 can be analyzed to comprise a first lower transistor 80 and a second upper transistor 82. The first or lower transistor 80 comprises the first layer 12, the second layer 20 and the second zone 36 of the first region 30. The second or upper transistor 82 comprises the second layer 20, the second zone 36 of the first region 30 and the second region 40. Thus, the base layer 20 of transistor 90 also forms a portion of the base of the first or lower transistor. Thus the disclosed monolithically integrated semiconductor device 10 can be considered to comprise a transistor portion 90 which is driven by a thyristor portion 85 in which the base of the driven transistor 90 is monolithically coupled to the thyristor 85. The emitter of the upper transistor 82 is coupled through the insulated gate structure 60 to the second electrode 78. In the on-state of device operation, the first and second gates 60 and 70, respectively, are both supplied with a sufficient bias potential to conductively couple the second region 40 to the second layer 20 and to the third region 50. Thus, the upper transistor 82 is conductively coupled to the second electrode 78. The inherent thyristor 85 thus functions like an insulated gate thyristor wherein regenerative conduction is established. Electrons are injected into the second layer 20 under the control of the second gate 70. In turn, holes are injected from first layer 12 into second layer 20. Holes traverse through the first region 30 to the cathode electrode 78 and in this process, the moderately doped second zone 36 of the first region 30 will increase in potential with respect to the second region 40. The second region 40, however, is connected through the first channel region 38a and third region 50 to the second electrode 78 and thus remains at the potential of the second electrode 78. Thus, junction 42 between the first and second regions 30 and 40, respectively, will become forward biased. Forward biasing the junction 42 promotes electron injection from the second region 40 into the second layer 20, ultimately leading to thyristor action involving the first layer 12, the second layer 20, the first region 30 and the second region 40.

It is desirable that the dopant level and charge distribution within the first region 30 and particularly the second zone 36 thereof, be chosen so that the depletion region associated with the junction 32 does not punch through to the second region 40 at the rated blocking voltages. Nevertheless, the dopant concentration of the second zone 36 of the first region 30 is to be kept small so that the turn-on current density remains small. Accordingly, the present thyristor driven transistor takes full advantage of the floating second region 40 to establish charge injection into the second layer to promote the turn-on of the thyristor 85 comprising first and second transistors 80 and 82.

Once regenerative conduction has been established within the inherent thyristor 85, the inherent transistor 90 is also activated or driven into conduction. More particularly, as is shown in FIG. 2, the second layer 20 forms the base of the inherent transistor 90 and the base of the inherent transistor 80. The second layer 20 functions as a conduit which supplies the base drive to the inherent transistor 90. The proximity of the inherent transistor 90 and the thyristor 85, as well as the moderately high doping concentration of the second layer and high level of regenerative current flowing in the thyristor all contribute to providing the inherent transistor with sufficient base drive to cause the inherent transistor's base region to be highly modulated, lowering the potential drop across the base.

Once the device is operating, it can be turned off by removing the bias from gate 60 or reversing the bias potential applied thereto. When the bias is removed from the insulated gate 60, the floating emitter or second region 40 of the thyristor 85 is decoupled from the second electrode 78 and the device essentially functions as an open base thyristor. Steady state off-condition can be maintained by holding the gate bias potential applied to gates 60 and 70 below the gate threshold wherein the first junction 32 blocks current flow through the device 10.

Figure 4:
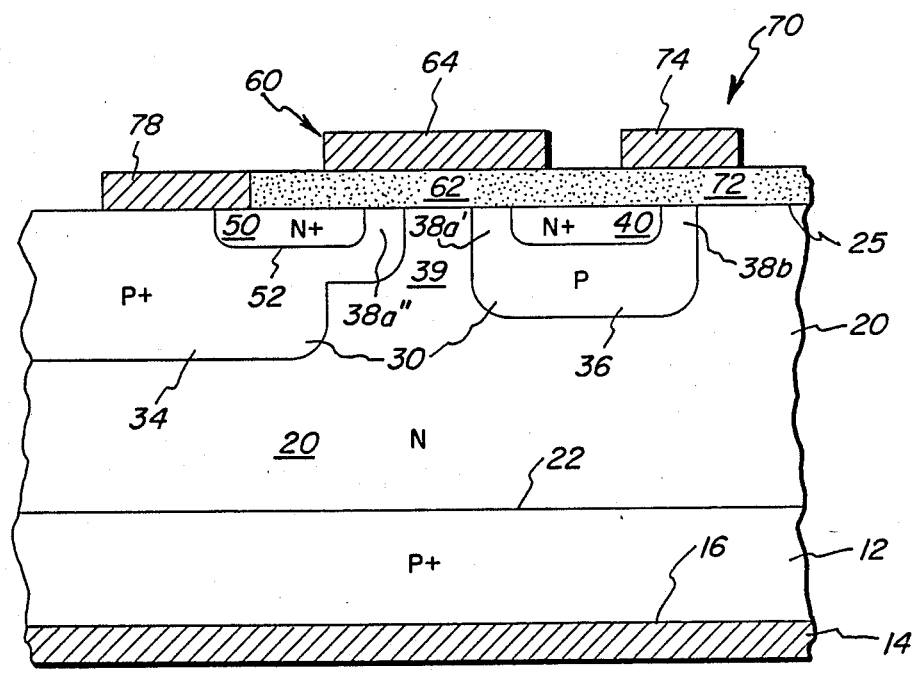
FIG. 4 is a cross-sectional illustration of a portion of a single cell of a monolithically integrated insulated gate semiconductor device in accordance with an alternate preferred embodiment of the present invention.

An alternate preferred embodiment of the present invention is shown in FIG. 4 wherein the first region 30 is shown to comprise two separate and discrete or spaced apart first and second portions 34 and 36, respectively, which are separated by a portion of the second layer 20 interposed therebetween. In this embodiment, the length of the channel portion 38a and the first region 30 disposed between the second and third regions 40 and 50, respectively, is reduced. More particulary, the second layer 20, which is of the same conductivity type as the second and third regions 40 and 50, respectively, comprises a portion of the current path between the second and third regions 40 and 50, respectively. In this embodiment, the resistance of the current path between the second and third regions is reduced because the second layer portion of the current path does not require inversion, but instead can be accumulated.

In this embodiment, forward conduction is achieved when both the second or on gate 70 and the first or off gate 60 are biased with an appropriate potential above their respective threshold voltages. The second region 40 also referred to as a floating emitter, is coupled to the second electrode 78 through an inversion layer 38a' in the P well 36, an accumulation layer 39 in the intervening portion of the second layer 20 and a second inversion layer 38a" in the P well 34.

A forward blocking state is achieved when the bias otherwise applied to the off-gate 60 is removed to thus decouple the inherent thyristor from the second electrode 78.

In this alternate embodiment, the P+ diffusion for the second portion 36 of the first region can be performed after the second region is established. Thus the impurity charge in the second portion 36 of the first region 30 can be independently controlled. In addition, only a single gate bias is required so that both gates 60 and 70 can be driven from a common supply. Further, the cell size can be smaller by virtue of the DMOS channels.

Figure 5:
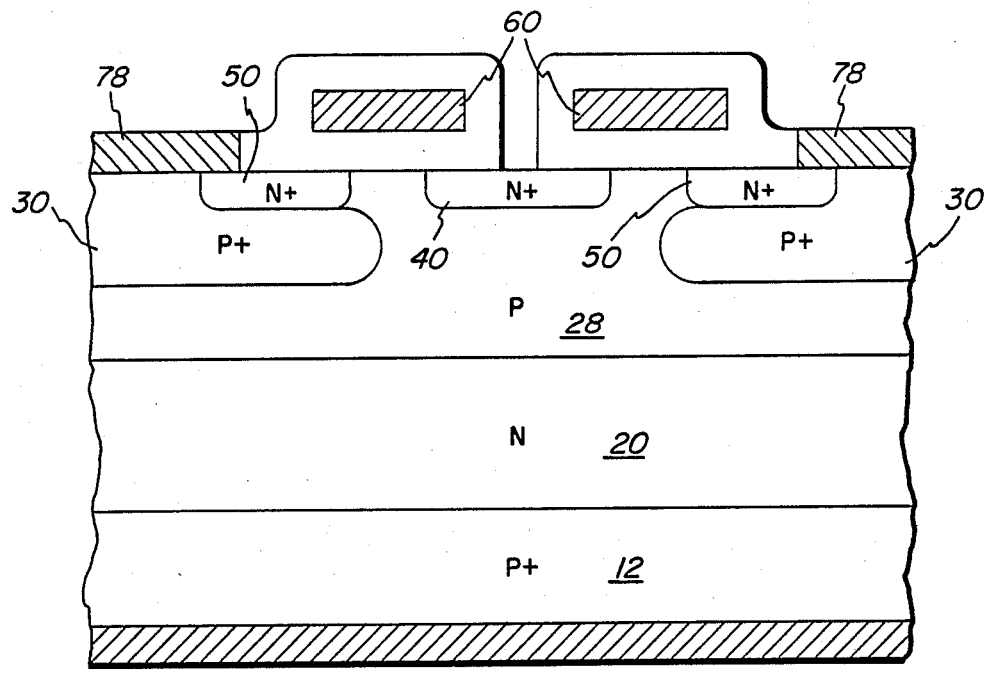
FIG. 5 is a cross-sectional illustration of a portion of a single cell of a monolithically integrated insulated gate semiconductor device in accordance with another preferred embodiment of the present invention.

Referring now to FIG. 5, a light triggered embodiment of the monolithically integrated insulated gate semiconductor device of the present invention is shown to comprise a three layer structure having first, second and third layers of alternating type conductivity. The first layer 12 is shown as a P type layer, while the second layer 20 is shown as an N type conductivity layer and the third layer 28 is shown as a P type conductivity layer. A first region 30 is shown as a heavily doped P type conductivity region, is disposed within the first layer 28. Second and third regions 40 and 50, respectively, of opposite type conductivity are disposed within the first region 30 and the third layer 28. A portion of the third layer 28 separates the second and third regions 40 and 50. An insulated gate 60 is disposed over a portion of the third layer 28 intervening between the second and third regions 40 and 50, respectively. A first portion of the second region 40 is exposed and is responsive to incident radiation of an appropriate wavelength to trigger into regenerative conduction a four layer structure comprising a first layer 12, a second layer 20, a third layer 28 and a second region 40.

A cathode electrode metal 78 is disposed in ohmic contact with the first and third regions 30 and 50, respectively. The gate electrode 60, in response to an appropriate bias, couples the emitter of the four layer structure or the second region 40 to the third region 50 and thence to the cathode electrode 78 to provide for gate controlled conduction within the device 10. In response to removal of the bias otherwise applied to gate 60, conduction in the four layer structure ceases. The active current flow in the four layer structure provides base drive to the inherent bipolar transistor comprising first layer 12, second layer 20, third layer 28 and first region 30 and triggers the inherent transistor into saturation conduction.

Figure 6:
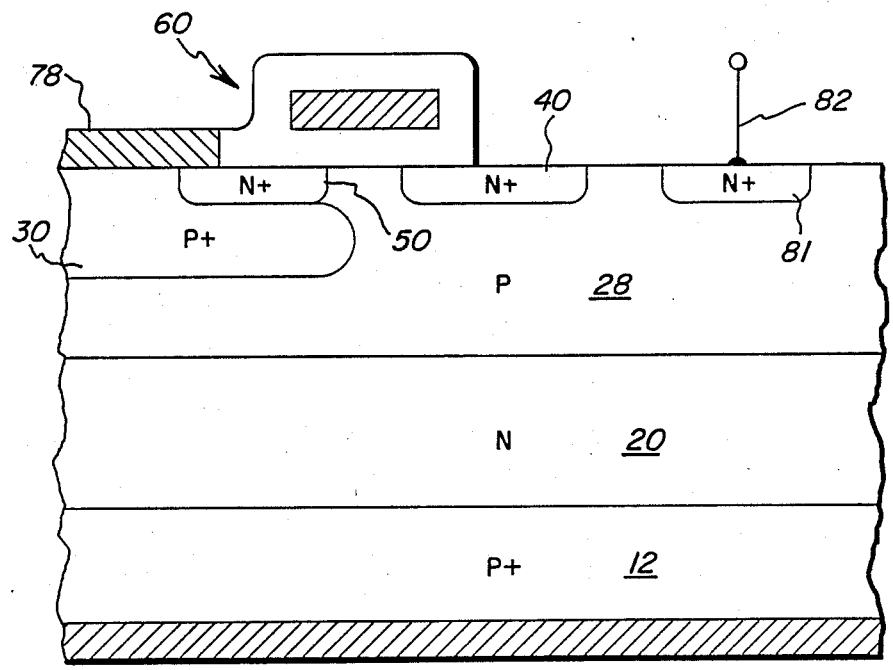
FIG. 6 is a cross-sectional illustration of a portion of a single cell of a monolithically integrated insulated gate semiconductor device in accordance with the present invention.

Referring now to FIG. 6, an alternate preferred embodiment of the monolithically integrated semiconductor device of the present invention is shown in a current activated embodiment. More particularly, the device comprises a three layer structure having a first layer 12 of one type conductivity shown as a P type layer; a second layer 20 of opposite type conductivity shown as an N type layer and a third layer 28 of one type conductivity shown as a P type layer. A first region 30 of one type conductivity is disposed within the first layer 28. Second and third regions 40 and 50, respectively, of opposite type conductivity are also disposed within the first region 30 and the third layer 28. A portion of the third layer 28 is disposed between the second and third regions 40 and 50, respectively, and separates the second region 40 from the third region 50. An insulated gate structure 60 is disposed atop the portion of the third layer 28 which intervenes between the second and third regions 40 and 50, respectively. In response to an appropriate bias, the insulated gate 60 couples the second region 40 to the third region 50. A cathode electrode 78 is disposed in ohmic contact with the first and third regions 30 and 50, respectively. In addition, a one type conductivity fourth region 81 is disposed within the third layer 28. A current gate electrode 82 is disposed in ohmic contact with the fourth region 81. In response to an appropriate bias, current is supplied to the fourth region 81 to establish a current flow between the third layer 28 and the fourth region 81 forward biasing the PN junction therebetween. If the gate structure 60 is also biased to established a conductive channel coupling the second and third regions 40 and 50, respectively, a four layer structure comprising the first layer 12, the second layer 20, the third layer 28 and the second region 40 is triggered into regenerative conduction whereby base drive current is supplied to the base of the inherent PNP transistor comprising the first layer 12, the second layer 20, the third layer 28 and the first region 30.

Figure 7:
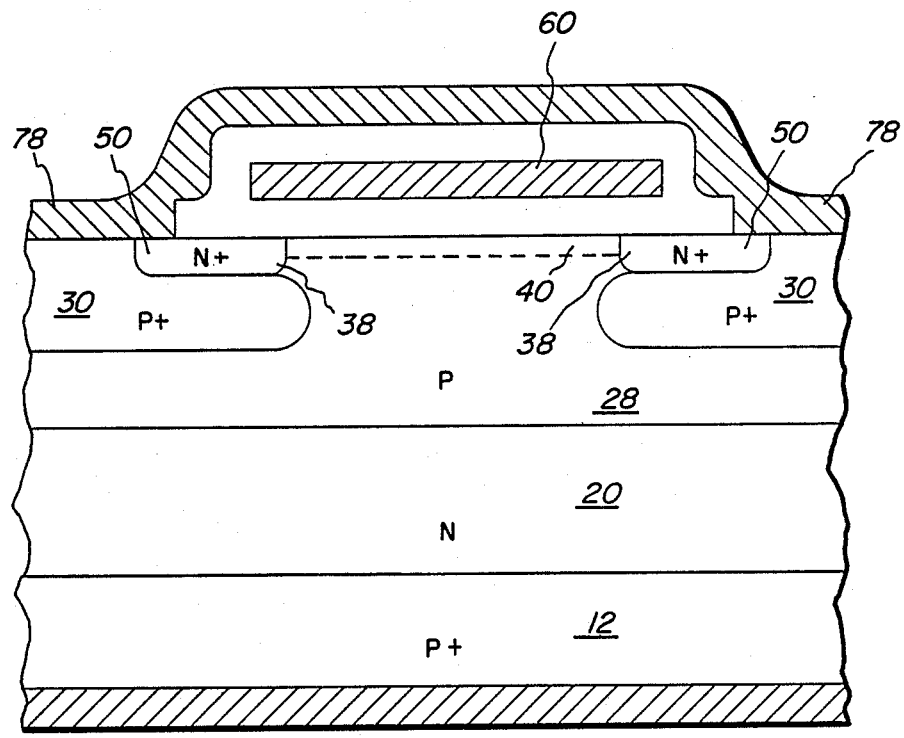
FIG. 7 is a cross-sectional illustration of a portion of a single cell of a monolithically integrated insulated gate semiconductor device in accordance with the present invention.

Referring now to FIG. 7, an alternate preferred embodiment of the monolithically integrated insulated gate semiconductor device of the present invention is shown wherein the second region 40 previously shown in FIGS. 2, 4, 5 and 6 has been removed and replaced instead by an inversion layer, shown in phantom, induced by the insulated gate 60. More particularly, the device 10 comprises a first layer 12 of one type conductivity, a second layer 20 of opposite type conductivity and a third layer 28 of one type conductivity. A first region 30 of one type conductivity is disposed within the third layer 28 and a third region 50 of opposite type conductivity is disposed within the first region 30 and within the third layer 28. A portion of the third layer 28 extends between adjacent portions of the first and third regions 30 and 50, respectively. An insulated gate 60 extends over the portion of the third layer 28 disposed between the opposed portions of the first and third regions 30 and 50, respectively. A cathode electrode 78 is disposed in ohmic contact with the first and third regions 30 and 50, respectively. The insulated gate 60, in response to an appropriate applied bias, induces an inversion layer 40, shown in phantom, between the opposed portion of the third region 50. This inversion layer 40 is of such nature and extent that it supplies a sufficient source of electrons to function as an emitter and thus forms a four layer structure comprising the first layer 12, the second layer 20, the third layer 28 and the inversion layer 40. When the insulated gate structure 60 is appropriately biased, the inversion layer 40 is coupled to the third region 50 and thence to the cathode electrode 78. Thus the monolithically integrated semiconductor device of the present invention assumes a regenerative conducting state and in doing so, supplies a base drive to the inherent bipolar transistor comprising the first layer 12, the second layer 20, the third layer 28 and the first region 30. In response to removal of the bias from the insulated gate 60, the regenerative conduction in the four layer structure ceases and the device is taken out of conduction.

Figure 8A:
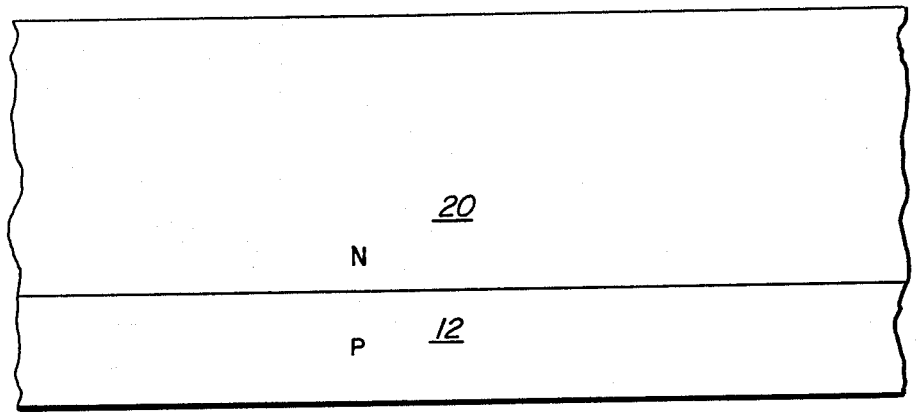
FIGS. 8A-8V are illustrations of a portion of a single cell of a monolithically integrated insulated gate semiconductor device during successive stages in a process of fabrication in accordance with the present invention.
Figure 8B:
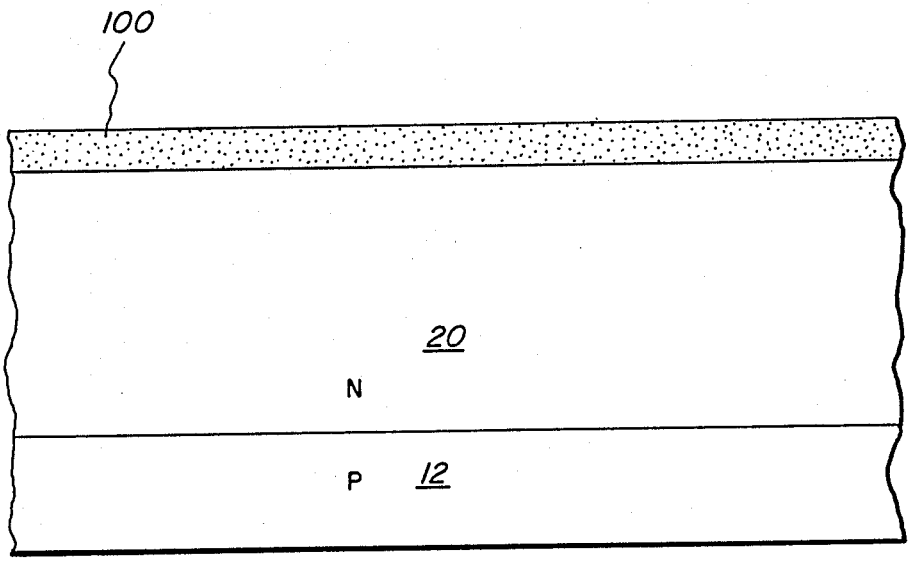
Figure 8C:
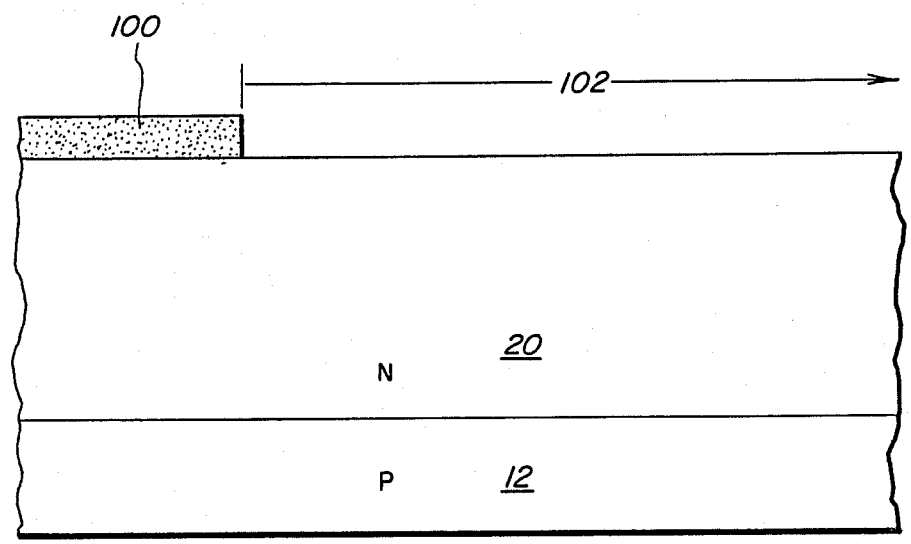
Figure 8D:
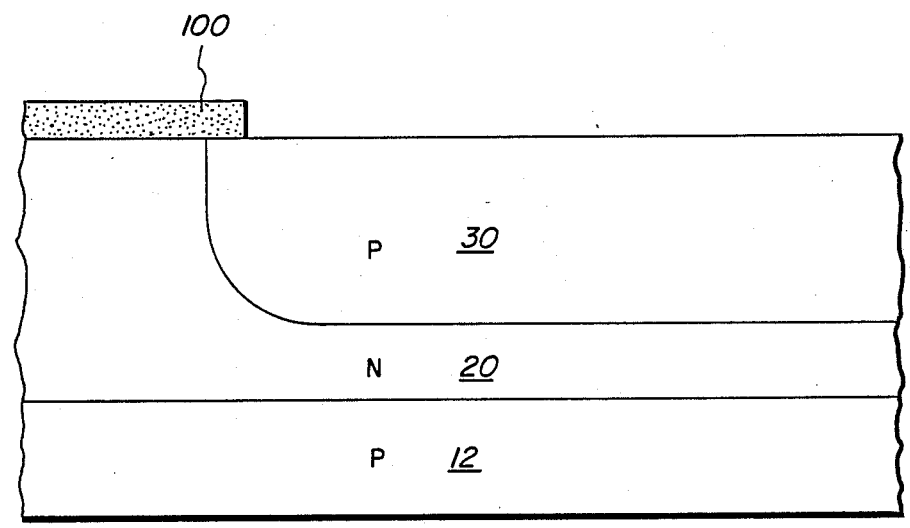
Figure 8E:
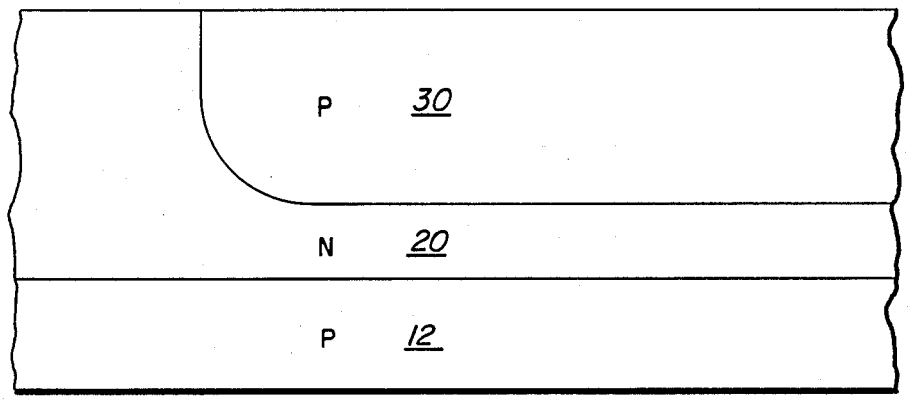
Figure 8F:
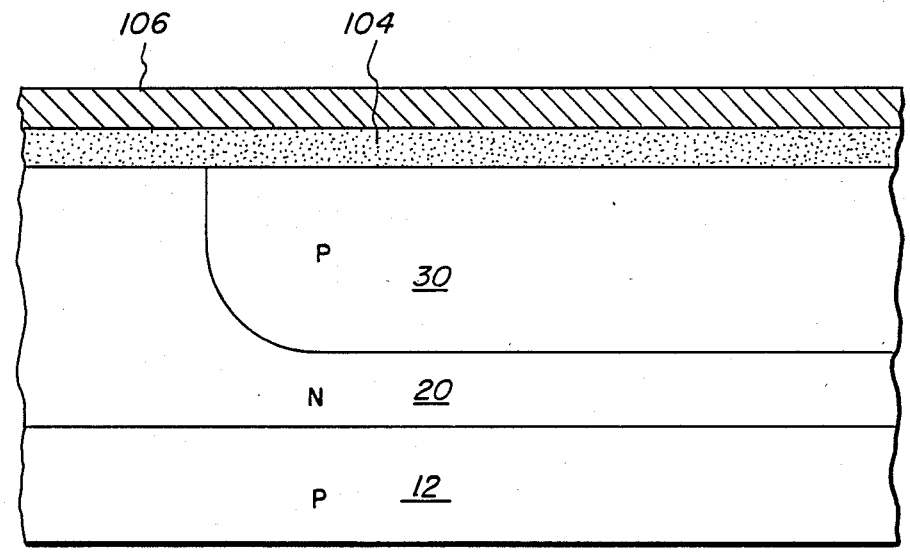
Figure 8G:
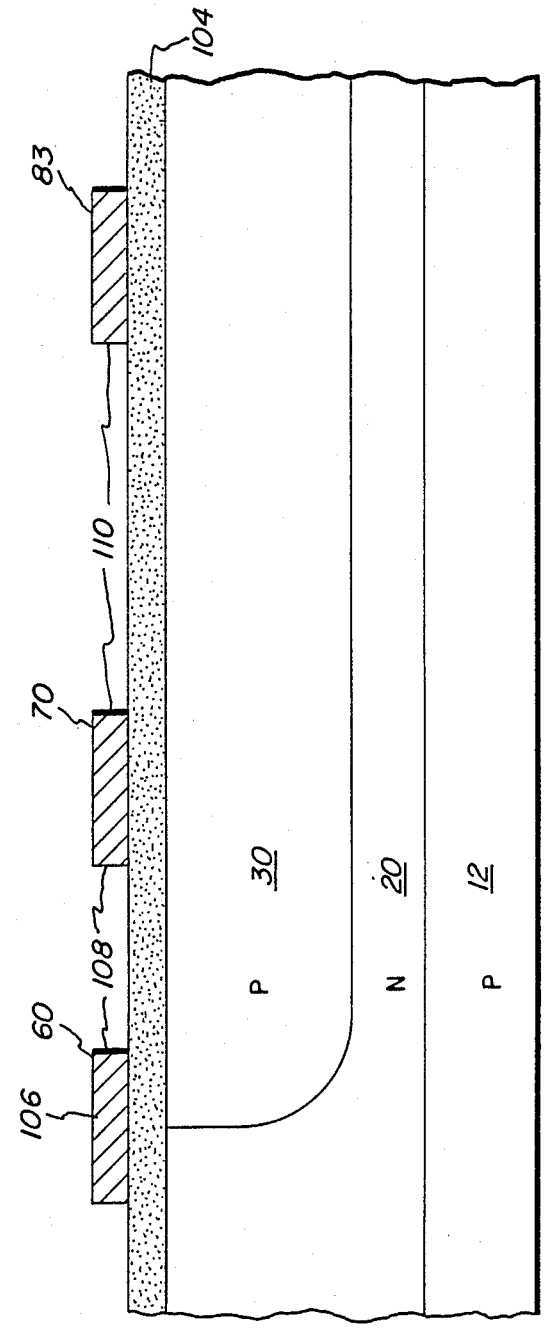
Figure 8H:
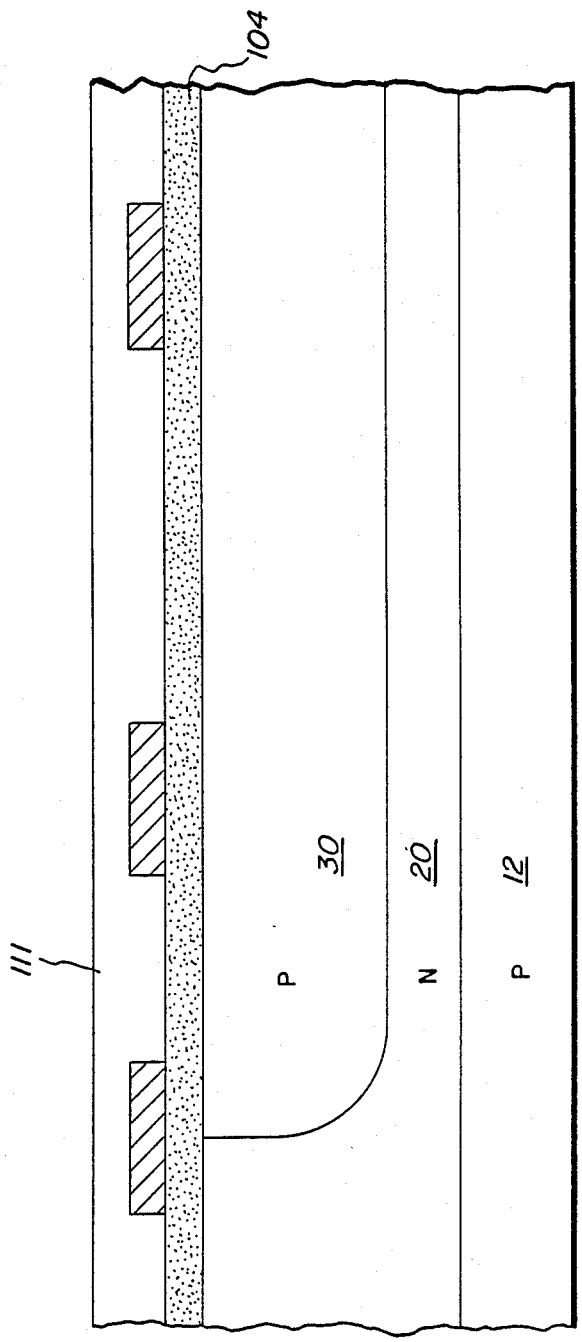
Figure 8I:
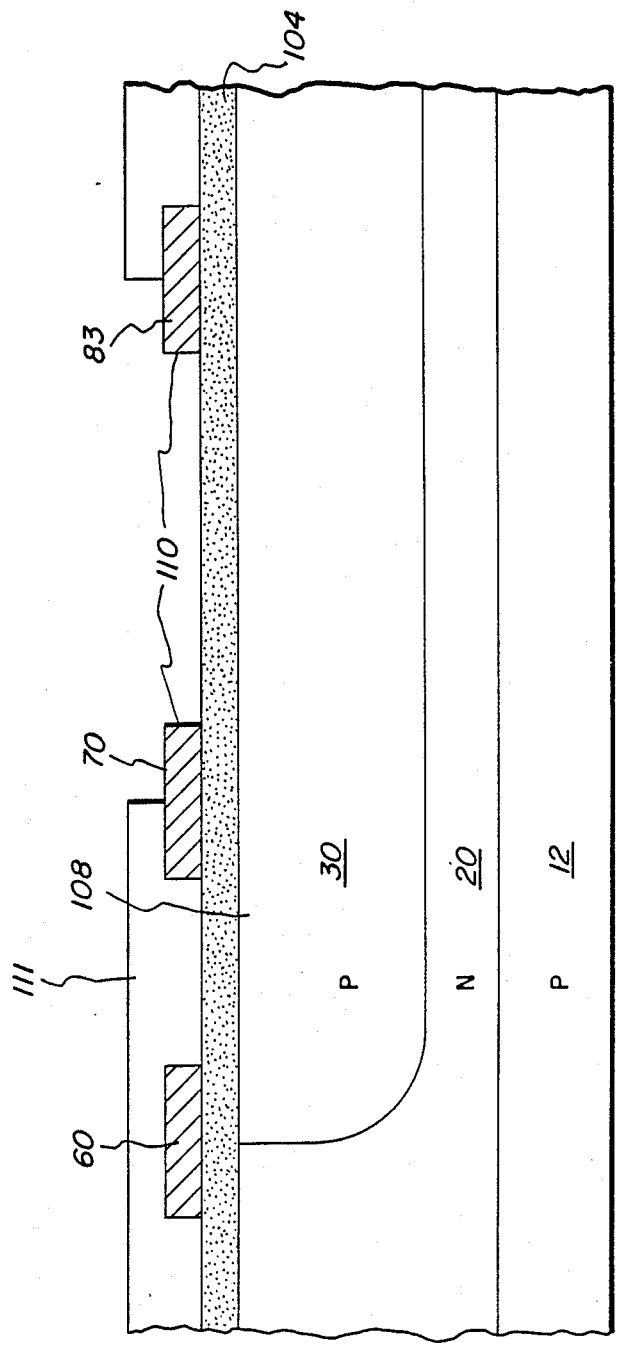
Figure 8J:
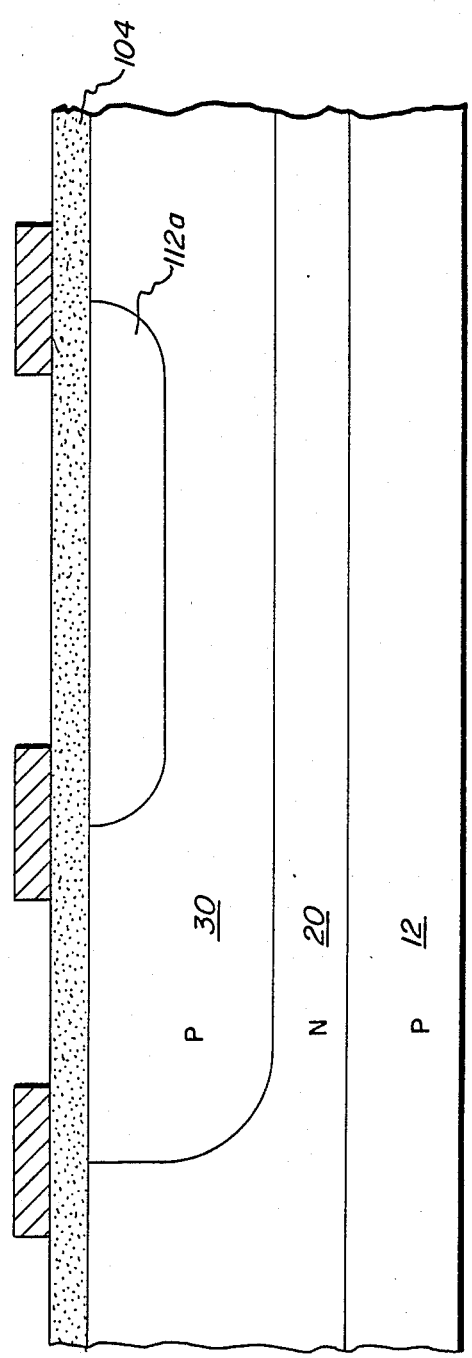
Figure 8K:
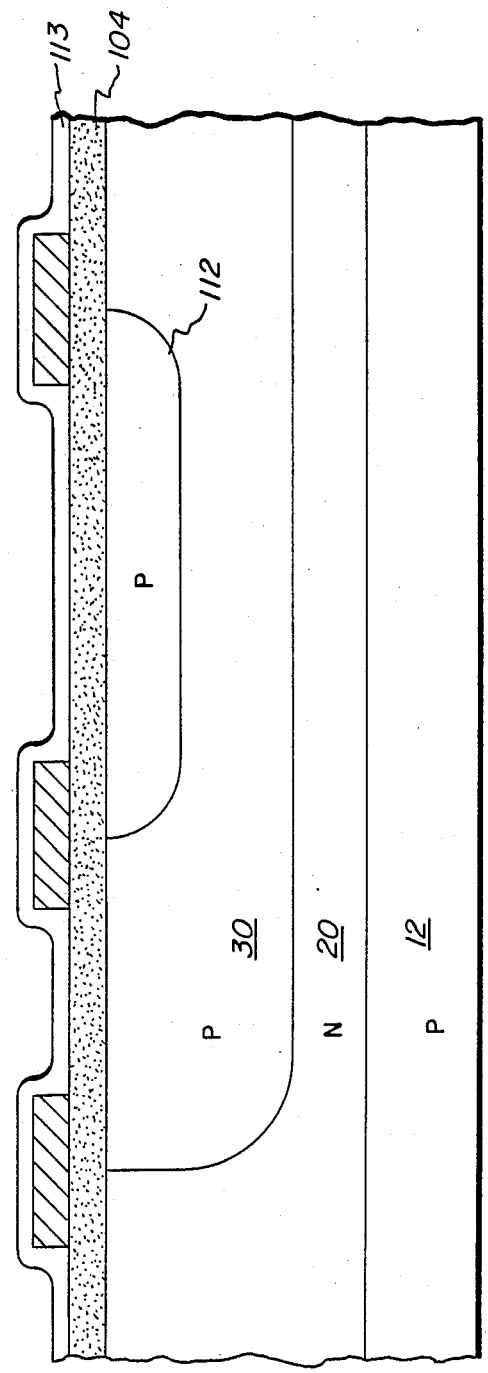
Figure 8L:
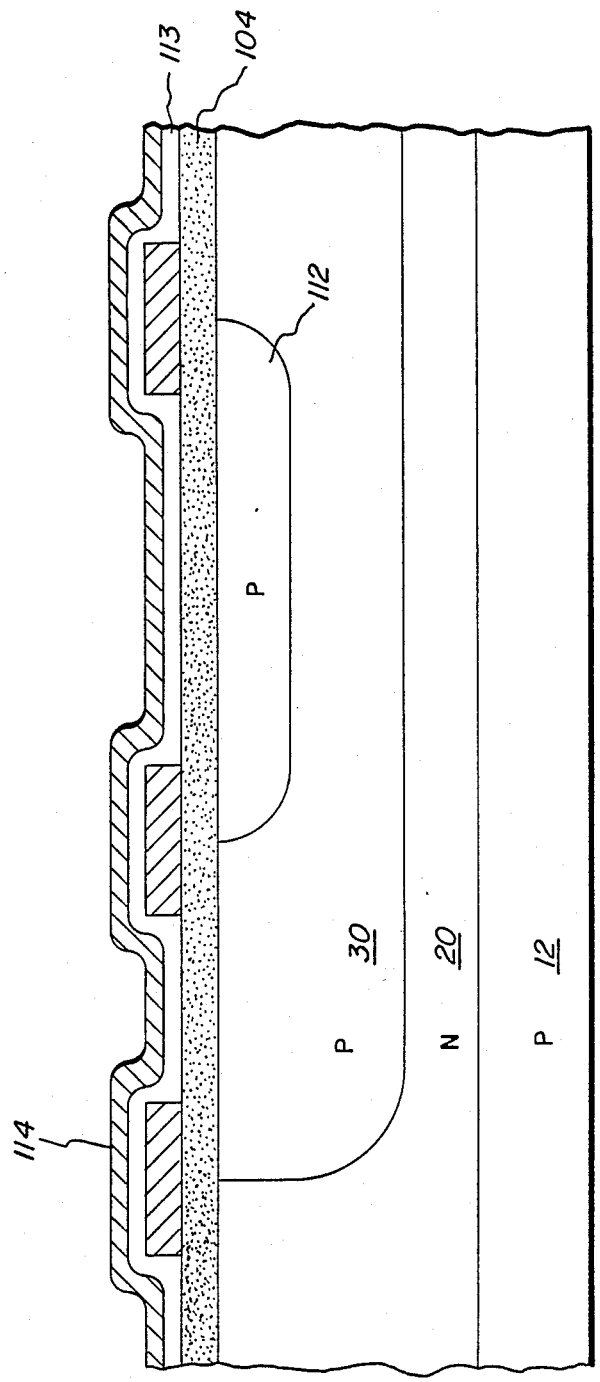
Figure 8M:
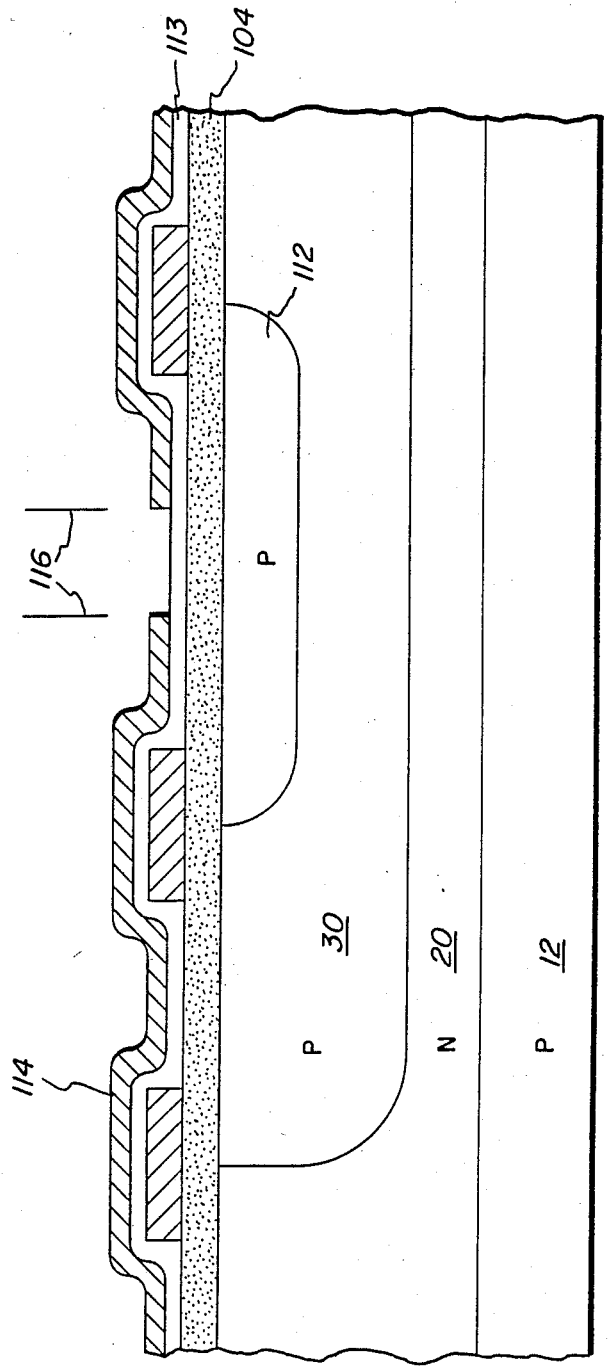
Figure 8N:
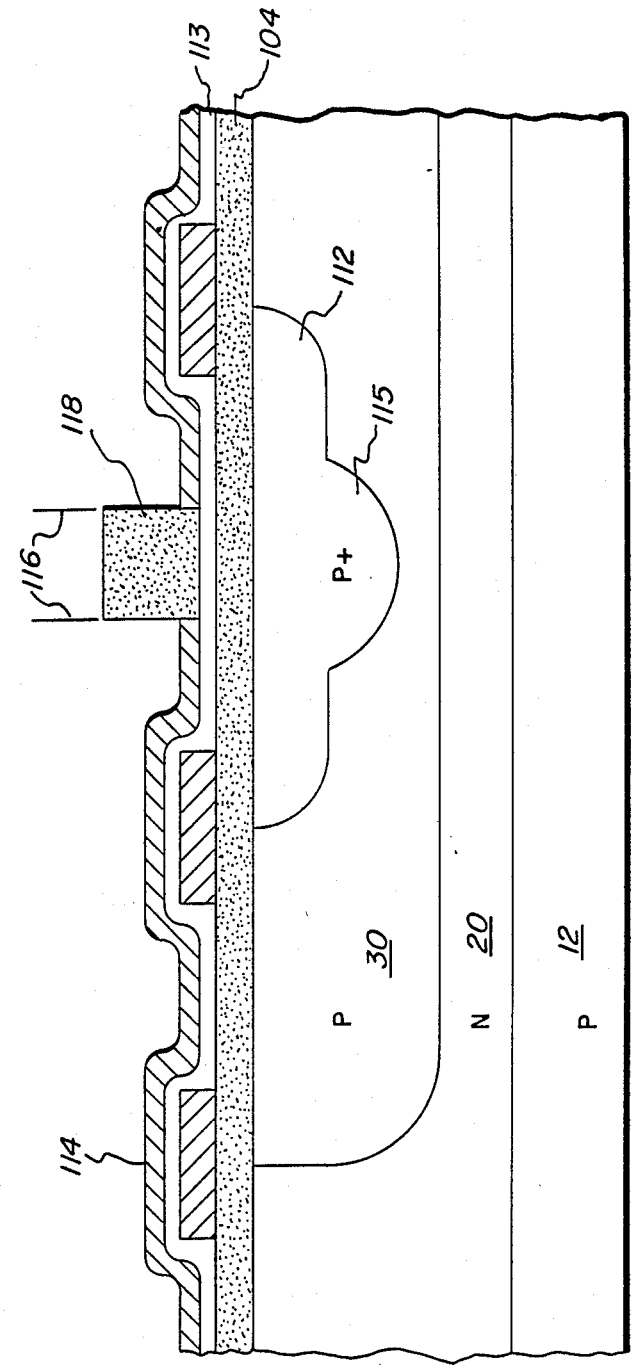
Figure 80:
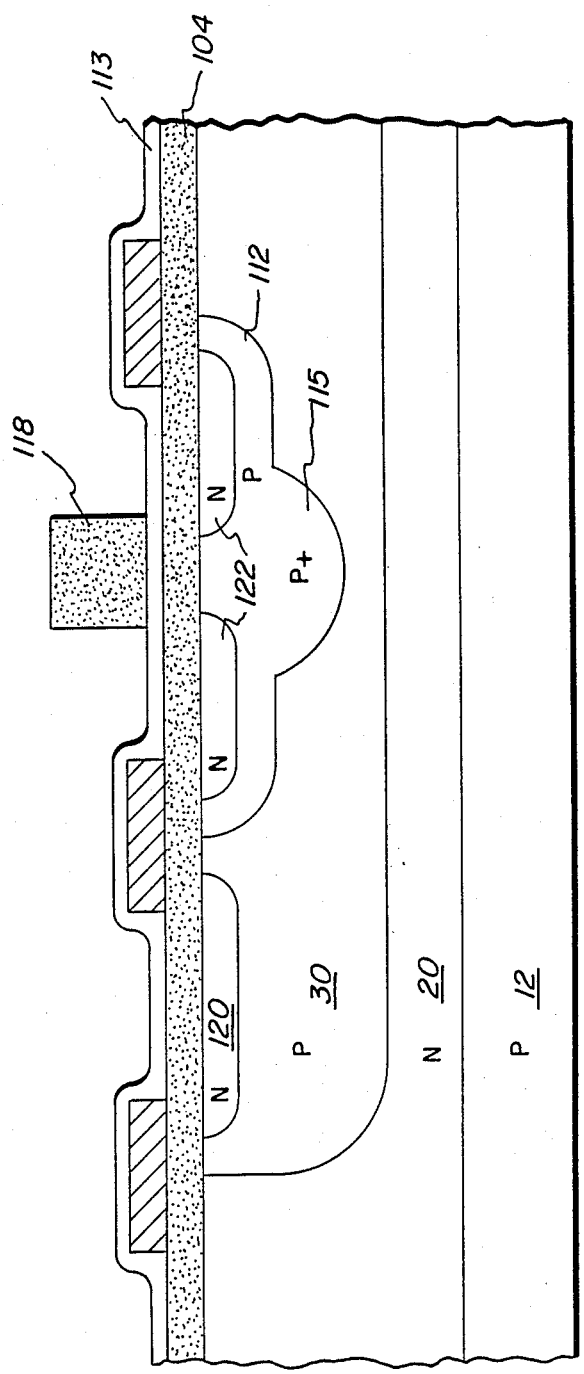
Figure 8P:
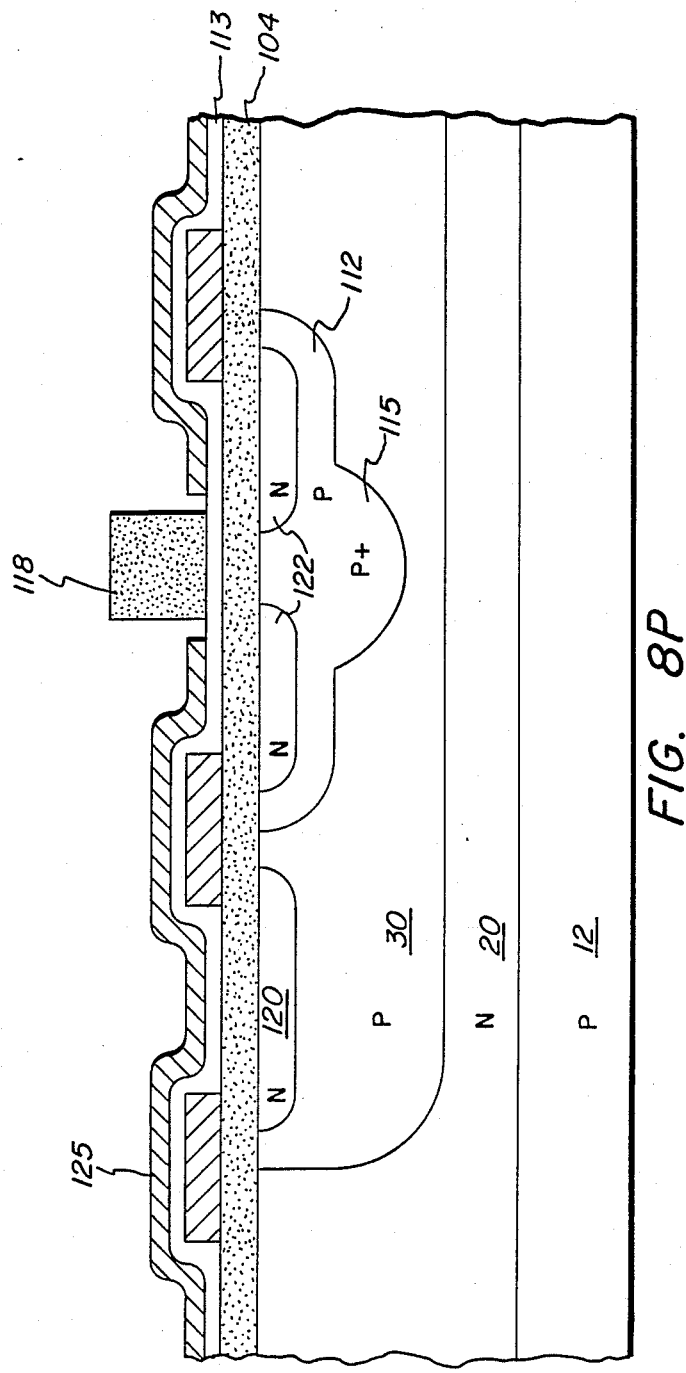
Figure 8Q:
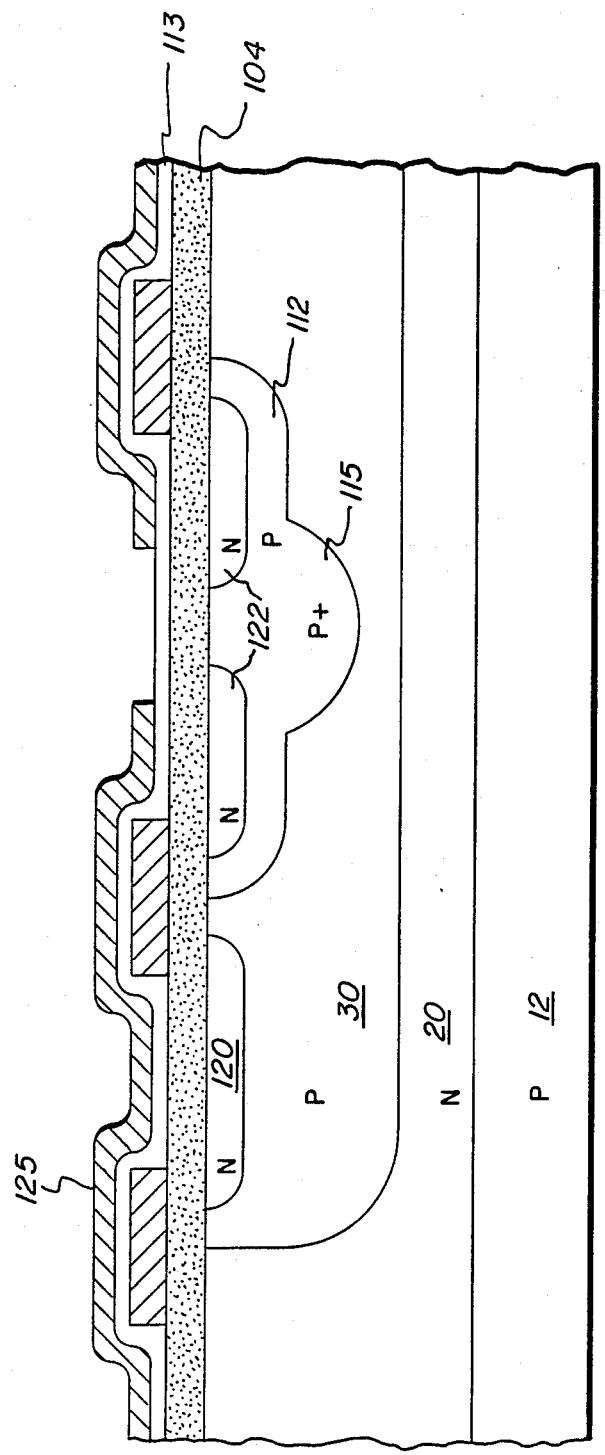
Figure 8R:
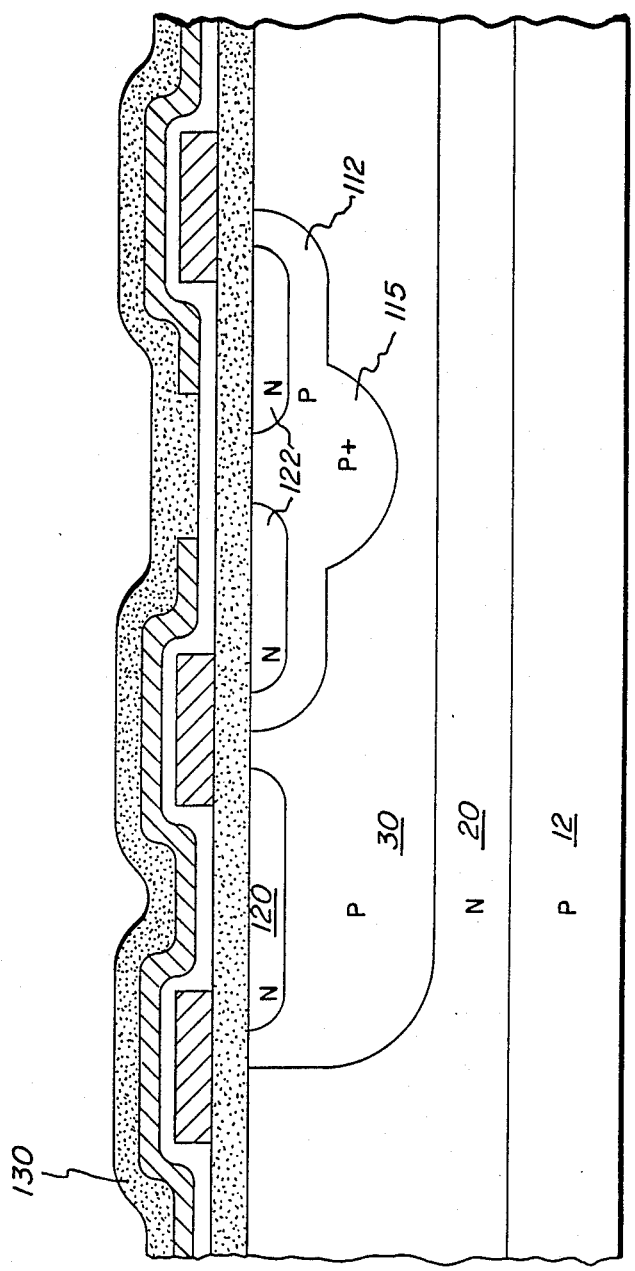
Figure 8S:
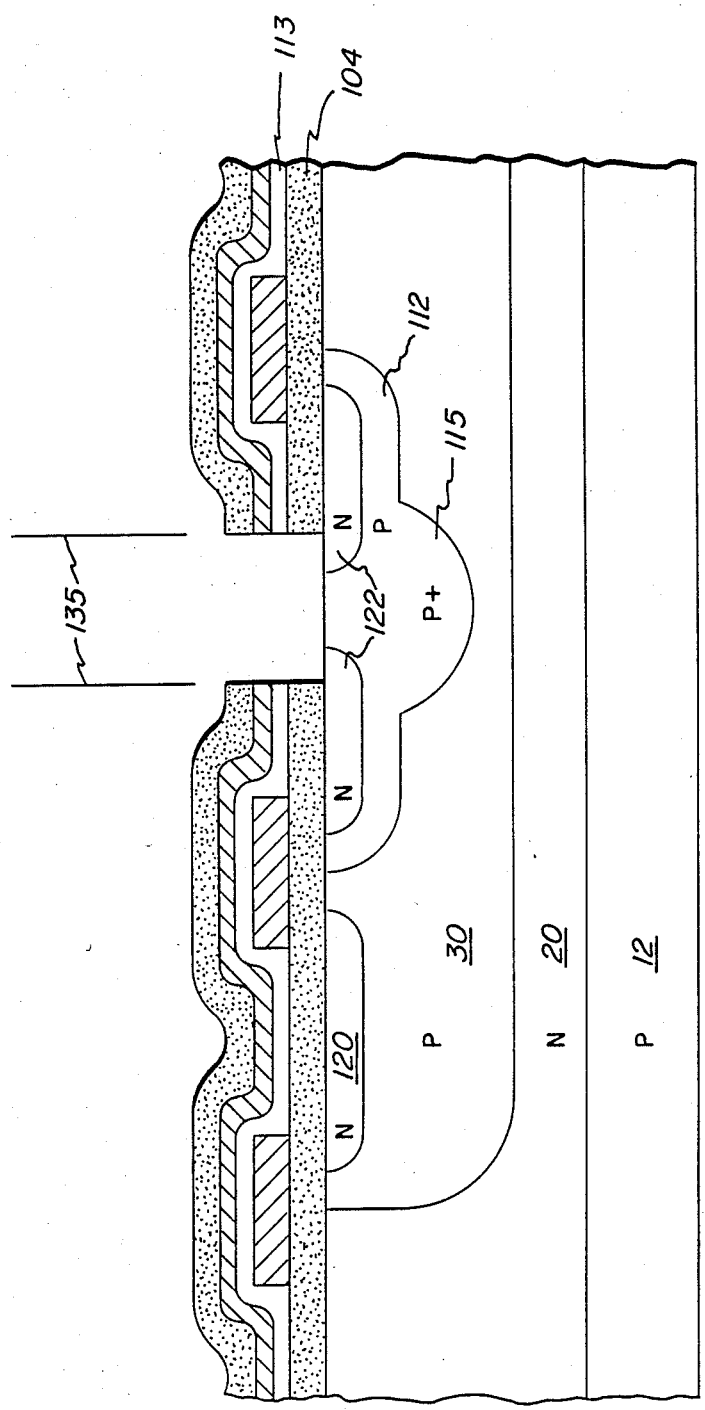
Figure 8T:
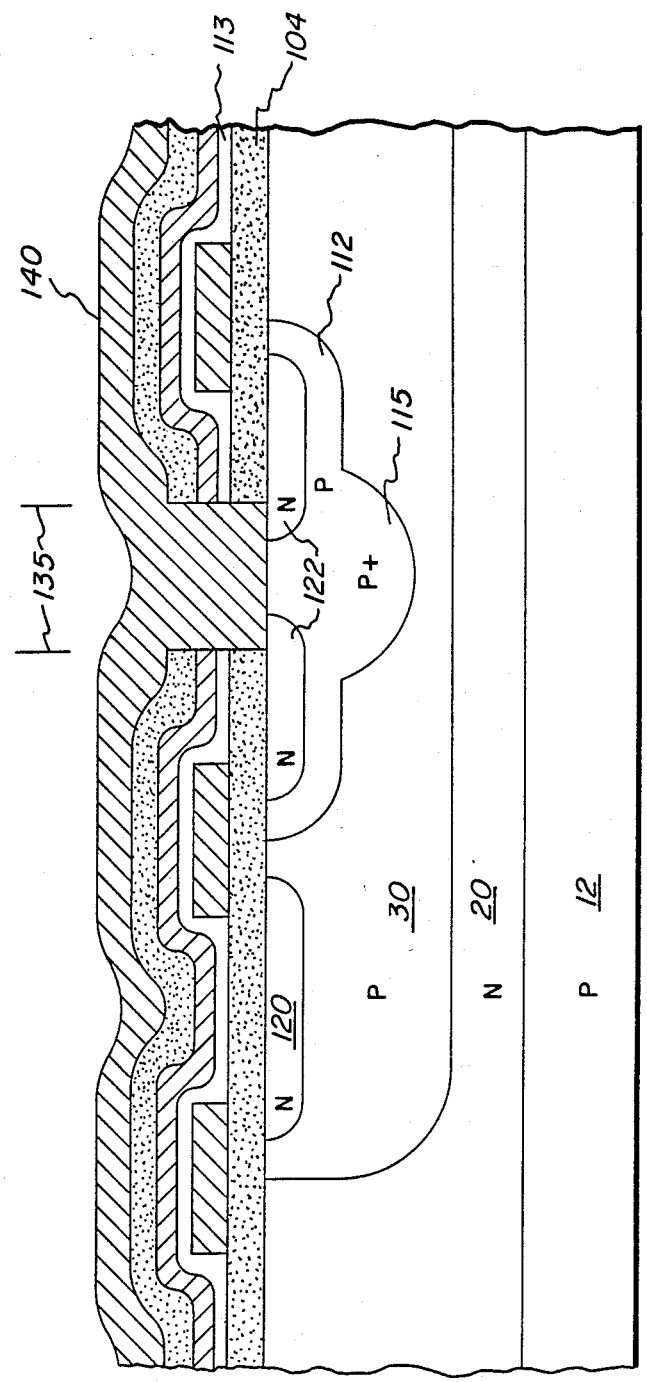
Figure 8U:
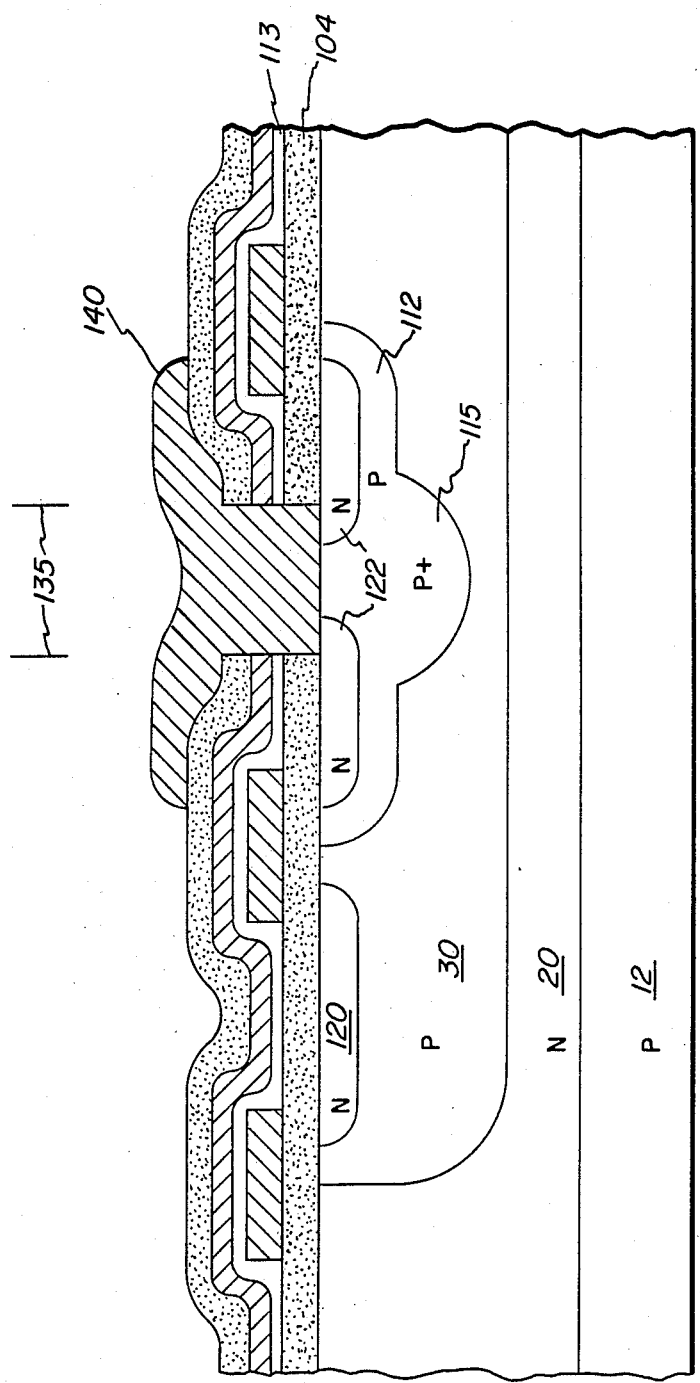
Figure 8V:
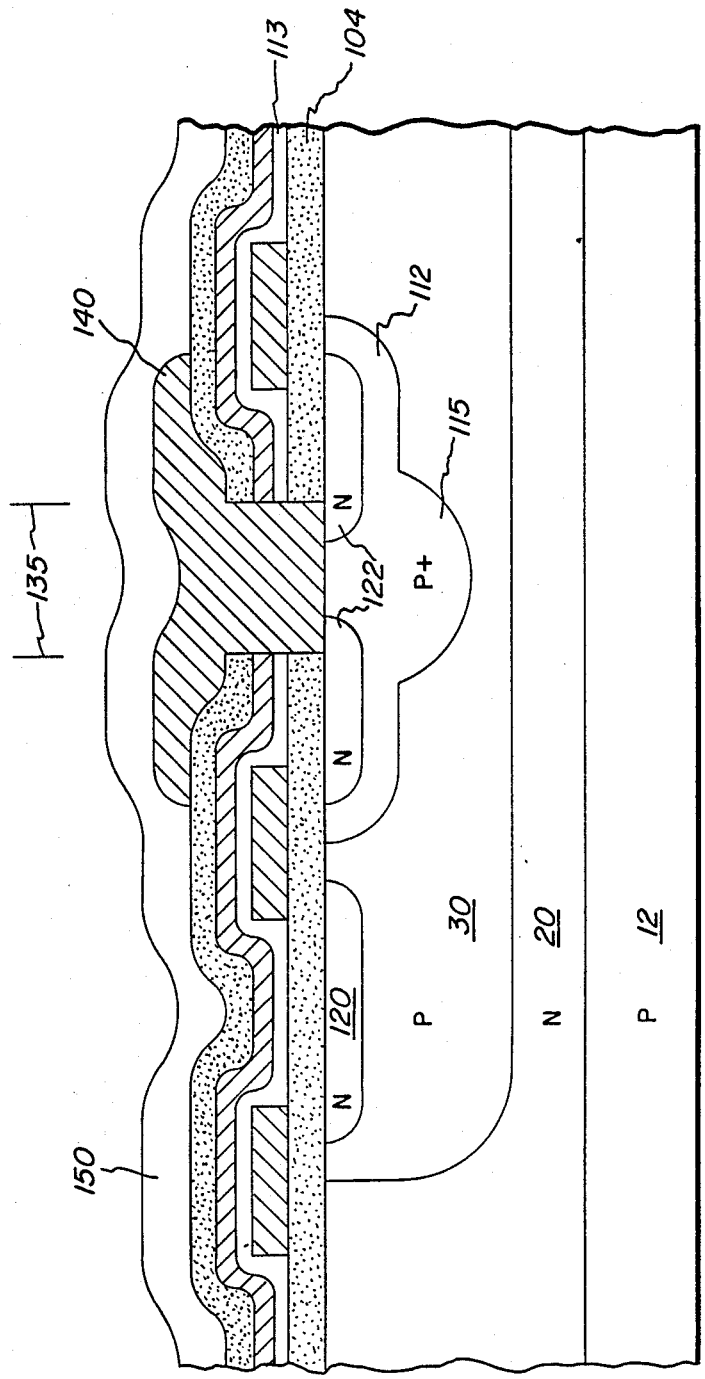

Referring now to FIGS. 8A-8V, a process of fabricating a monolithically integrated gate semiconductor device in accordance with the present invention is shown to comprise the following steps. Initially, a semiconductor body comprising first and second layers 12 and 20, respectively, of alternate type conductivity is provided. In the illustrated embodiment, a first layer 12 of one type conductivity is provided with the second layer 20 of opposite type conductivity disposed thereon. Either the first or the second layer can be the substrate layer and the other layer can be provided by epitaxial growth or doping techniques such as implantation and diffusion techniques.

As shown in FIG. 8B, a first protective layer 100 such as a thick 5000 angstrom silicon dioxide layer is disposed on the first surface 25 of the second layer 20.

Referring now to FIG. 8C, a first window 102 is opened through the first protective layer to expose a first surface portion of the second layer 20.

As shown in FIG. 8D, a first implant is performed with one type conductivity dopants such as boron atoms and driven to an appropriate depth to establish a P well or first region 30 within the second layer 20.

Thereafter, as is shown in FIG. 8E, the oxide layer 100 is removed by employing a suitable etch such as a hydrofluoric etch. Subsequently, as is shown in FIG. 8F, a thin gate oxide 104 having a thickness of approximately 1000 angstroms is then grown and a polysilicon layer 106 is deposited thereon.

As shown in FIG. 8G, the polysilicon layer 106 is then patterned using a mask in combination with appropriate photolithographic techniques to establish first, second and third polysilicon islands 60, 70 and 83, respectively, and windows 108 and 110. Thereafter, a photoresist layer 111 is deposited on the exposed surface of the device as shown in FIG. 8H. The photoresist layer 111 is then patterned as is shown in FIG. 8I to cover the island 60, the window 108 and portion of the island 70 and 83, but to re-expose the window 110. Thereafter, an implantation is made through the window 110 and the oxide layer 104 disposed therein with a one type conductivity impurities such as boron atoms to establish a P type region 112a shown in FIG. 8J. The photoresist layer 111 is then removed and the implanted P type region 112a is driven to an appropriate depth as shown in FIG. 8K to establish the P base region 112 within the P well 30. During the drive of the P-base region 112, an oxide layer 113, also shown in FIG. 8K, is grown on the exposed surfaces of the layer 104 and the polysilicon layer 106. Thereafter, as shown in FIG. 8L, a suitable technique, such as low pressure chemical vapor deposition (LPCVD), is employed to deposit a nitride layer 114 on the exposed surface of the device. The LPCVD nitride layer 114 is then pattern by, for instance, employing a mask (not shown) in combination with an appropriate photolithographic technique to open a window 116 through the LPCVD layer 114 as is shown in FIG. 8M. A deep P+ diffusion is then performed in an oxygen atmosphere to produce a deep P-region 115 shown in FIG. 8N which is aligned in a diffused manner with the P base region 112 and is situated beneath the window 116. During the diffusion cycle, and oxide plug 118 also shown in FIG. 8N is grown over the P+ diffusion 115.

As shown in FIG. 8O, the LPCVD nitride layer 114 is removed using an appropriate etchant to re-expose the oxide layer 113. An implantation is then performed with a material such as phosphorous to establish first and second opposite type conductivity regions 120 and 122 shown in FIG. 8O. The implant does not substantially penetrate the portion of the P base 112 situated beneath the plug 118 and thus the region beneath the plug remains substantially P base 112.

Thereafter, and as is shown in FIG. 8P, a second LPCVD nitride layer 125 is deposited on the exposed surface of the device. As is shown in FIG. 8Q, the oxide plug 118 is removed by employing a suitable etch such as a buffered hydrofluoric acid etch.

A layer of low temperature oxide (LTO) 130 shown in FIG. 8R is then deposited in a thickness of approximately 7,900 angstroms on the exposed surface of the device to form a interlevel dielectric densifier. The LTO layer 130 is then patterned using a mask (not shown) in combination with appropriate photolithographic techniques to establish a contact window 135 shown in FIG. 8S through the LTO oxide 130 as well as the previously deposited oxides 113 and 104. A metallization layer 140 such as an aluminum layer is then deposited over the LTO layer 130 and within the contact opening 135 to establish an ohmic contact with the base region 112 and the N region 122 as is shown in FIG. 8T. Thereafter, the metal layer 140 is patterned as is shown in FIG. 8U by employing a mask (not shown) in combination with an appropriate photolithographic technique. Finally, a passivating glass 150 is deposited on the exposed surface of the device as is shown in FIG. 8V.

It is to be recognized that while the preferred embodiment of the present invention has been disclosed with respect to a monolithically integrated thyristor driven transistor, the preferred embodiments of the present invention are not so limited. The improved semiconductor device of the present invention has broad application to a variety of semiconductor devices in which a first inherent device is driven by a second active device. Further, while the above-discussed examples treat a single cell in particular, a device in accordance with the present invention comprises a plurality of cells.

Thus, a monolithically integrated semiconductor device has been provided in which an inherent bipolar transistor is driven by an insulated gate controlled thyristor to thereby turn the inherent bipolar transistor fully on and achieve maximum conduction therefrom. While the illustrated embodiment employs an insulated gate thyristor, it is recognized that a variety of active devices can be employed as the drive source for the inherent transistor.

While the preferred embodiments have been illustrated and described, it is clear that the present invention is not so limited. Numerous modifications and changes, variations and substitutions and equivalents will occur to those skilled in the art without departing from the true spirit and scope of the present invention. Accordingly, it is intended that the invention herein be limited only by the scope of the appended claims.

What is claimed is:

1. A monolithically integrated semiconductor device comprising:
   a body of semiconductor material comprising:
      a first layer of one type conductivity,
      a second layer of opposite type conductivity forming a first PN junction with said first layer,
         a first region of one type conductivity disposed within said second layer and forming a second PN junction therewith,
         a second region of opposite type conductivity disposed within said first region and forming a third PN junction therewith, a third region of opposite type conductivity, disposed within said first region, forming a fourth PN junction therewith and spaced from said second region;

an insulated gate electrode disposed over said first region and extending to the edge of each of said second and third regions;

a first main electrode disposed in ohmic contact with said first layer;

a second main electrode disposed in ohmic contact with said first and third regions; and when an appropriate main bias is applied across said first and second main electrodes and said insulated gate electrode is at a first bias voltage a conductive channel for carriers of said opposite conductivity type extending between said second and third regions is established for establishing a current flow through said device between said first and second main electrodes whereby an improvement in the conductivity modulation of the second layer is achieved by the injection of carriers from the second region into the second layer and said insulated gate electrode when at a second bias voltage fails to establish said conductive channel whereby said current flow is not established, or if present, is extinguished.

2. The semiconductor device of claim 1 further including a gate means for controllably coupling said second region to said second layer wherein when said appropriate main bias is applied across said first and second main electrodes and a third bias voltage is applied to said gate means a fourth layer structure comprising said first layer, said second layer, said first region and said second region is triggered into conduction.

3. The semiconductor device of claim 2 wherein said insulated gate is coupled to said gate means and said third bias voltage is applied simultaneous with said first bias voltage.

4. The semiconductor device of claim 1 wherein:
said second region is free of ohmic connections to said second main electrode.

5. The semiconductor device of claim 4 further including a gate means for controllably coupling said second region to said second layer wherein when said appropriate main bias is applied across said first and second main electrodes and a third bias voltage is applied to said gate means a fourth layer structure comprising said first layer, said second layer, said first region and said second region is triggered into conduction.

6. The semiconductor device of claim 5 wherein said insulated gate is coupled to said gate means and said third bias voltage is applied simultaneous with said first bias voltage.

7. The semiconductor device of claim 1 wherein said insulated gate overlaps said second and third regions.

8. The semiconductor device of claim 2 wherein said gate means is an insulated gate structure.

9. The semiconductor device of claim 2 wherein said gate means comprises a light responsive gate.

10. The semiconductor device of claim 2 wherein said gate means comprises a current responsive gate.

* * * * *